(12) United States Patent
Tucker et al.

(10) Patent No.: US 10,214,956 B2
(45) Date of Patent: Feb. 26, 2019

(54) HEAT TREATABLE COATED ARTICLE HAVING TITANIUM NITRIDE AND NICKEL CHROME BASED IR REFLECTING LAYERS

(71) Applicant: Guardian Glass, LLC, Auburn Hills, MI (US)

(72) Inventors: Patricia Tucker, Lambertville, MI (US); Philip J. Lingle, Temperance, MI (US); Yiwei Lu, Ann Arbor, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 0 days.

(21) Appl. No.: 15/398,813

(22) Filed: Jan. 5, 2017

(65) Prior Publication Data

US 2018/0187477 A1 Jul. 5, 2018

(51) Int. Cl.
| | |
|---|---|
| B32B 15/04 | (2006.01) |
| B32B 17/06 | (2006.01) |
| E06B 9/24 | (2006.01) |
| C23C 14/06 | (2006.01) |
| C23C 14/18 | (2006.01) |
| C23C 14/34 | (2006.01) |
| C03C 17/36 | (2006.01) |
| C03C 17/34 | (2006.01) |

(52) U.S. Cl.
CPC ............ *E06B 9/24* (2013.01); *C03C 17/3435* (2013.01); *C03C 17/366* (2013.01); *C03C 17/3626* (2013.01); *C03C 17/3642* (2013.01); *C03C 17/3681* (2013.01); *C23C 14/0617* (2013.01); *C23C 14/0652* (2013.01); *C23C 14/185* (2013.01); *C23C 14/34* (2013.01); *C03C 2217/22* (2013.01); *C03C 2217/261* (2013.01); *C03C 2217/281* (2013.01); *C03C 2218/156* (2013.01); *E06B 2009/2417* (2013.01)

(58) Field of Classification Search
USPC ......................................................... 428/426
See application file for complete search history.

(56) References Cited

U.S. PATENT DOCUMENTS 3,885,855 A * 5/1975 Gross ...................... C03C 17/22
359/360
4,690,871 A * 9/1987 Gordon ............... C03C 17/3435
428/432

(Continued)

FOREIGN PATENT DOCUMENTS

| DE | 10-2014-114330 | 4/2016 |
|---|---|---|
| JP | 63-206333 | 8/1988 |
| JP | 63206333 | * 8/1988 |

OTHER PUBLICATIONS

JP63206333 English machine translation.*

(Continued)

*Primary Examiner* — Lauren R Colgan
(74) *Attorney, Agent, or Firm* — Nixon & Vanderhye P.C.

(57) ABSTRACT

Coated articles include two or more functional infrared (IR) reflecting layers sandwiched between at least dielectric layers. The dielectric layers may be of or including silicon nitride or the like. At least one of the IR reflecting layers is of or including titanium nitride (e.g., TiN) and at least another of the IR reflecting layers is of or including NiCr (e.g., NiCr, $NiCrN_x$, NiCrMo, and/or $NiCrMoN_x$).

35 Claims, 1 Drawing Sheet

(56) References Cited

U.S. PATENT DOCUMENTS

| | | | |
|---|---|---|---|
| 4,847,157 A * | 7/1989 | Goodman | B32B 17/10018 427/160 |
| 5,132,161 A * | 7/1992 | Shibata | B32B 17/10174 343/704 |
| 5,216,542 A | 6/1993 | Szczyrbowski et al. | |
| 5,342,675 A * | 8/1994 | Kobayashi | C03C 17/3435 359/580 |
| 5,543,229 A * | 8/1996 | Ohsaki | C03C 17/3435 428/216 |
| 5,688,585 A * | 11/1997 | Lingle | C03C 17/36 359/359 |
| 6,159,607 A | 12/2000 | Hartig et al. | |
| 6,188,512 B1 * | 2/2001 | Woodard | B32B 17/10018 359/359 |
| 6,524,714 B1 * | 2/2003 | Neuman | C03C 17/3435 427/165 |
| 6,749,941 B2 | 6/2004 | Lingle | |
| 6,890,659 B2 | 5/2005 | Stachowiak | |
| 6,926,967 B2 | 8/2005 | Neuman et al. | |
| 6,994,910 B2 | 2/2006 | Stachowiak | |
| 7,037,587 B2 | 5/2006 | Lin | |
| 7,081,301 B2 | 7/2006 | Stachowiak | |
| 8,286,395 B2 | 10/2012 | Mauvernay et al. | |
| 2002/0192473 A1 | 12/2002 | Gentilhomme et al. | |
| 2003/0143435 A1 * | 7/2003 | Schicht | C03C 17/2453 428/697 |
| 2003/0203215 A1 | 10/2003 | Shimatani et al. | |
| 2004/0023125 A1 | 2/2004 | Nozawa et al. | |
| 2007/0056961 A1 | 3/2007 | Shimatani et al. | |
| 2008/0138547 A1 * | 6/2008 | Maschwitz | C03C 17/36 428/34 |
| 2011/0262726 A1 * | 10/2011 | Knoll | C03C 17/36 428/213 |
| 2012/0177899 A1 * | 7/2012 | Unquera | C03C 17/36 428/213 |
| 2012/0225316 A1 * | 9/2012 | Imran | C03C 17/36 428/623 |

OTHER PUBLICATIONS

Machorro et al., Modification of Refractive Index in Silicon Oxynitride Films During Deposition:, Material Letters pp. 47-50, vol. 45, No. 1, Aug. 1, 2000.

* cited by examiner

HEAT TREATABLE COATED ARTICLE HAVING TITANIUM NITRIDE AND NICKEL CHROME BASED IR REFLECTING LAYERS

This invention relates to coated articles that include two or more functional infrared (IR) reflecting layers sandwiched between at least dielectric layers, and/or a method of making the same. In example embodiments, at least one of the IR reflecting layers is of or including titanium nitride (e.g., TiN) and at least another of the IR reflecting layers is of or including NiCr. The coating may be designed so that the coated articles realize one or more of: desirable glass side and/or film side reflective visible coloration that is not too red (e.g., reflective a* color value(s) from −8 to +1.6); a desirably low solar heat gain coefficient (SHGC); desirable visible transmission (TY or $T_{vis}$); thermal stability upon optional heat treatment (HT) such as thermal tempering; desirably low normal emittance ($E_n$); and/or desirably high light-to-solar gain ratio (LSG). Such coated articles may be used in the context of monolithic windows, insulating glass (IG) window units, laminated windows, and/or other suitable applications.

BACKGROUND AND SUMMARY OF THE INVENTION

Low solar factor (SF) and solar heat gain coefficient (SHGC) values are desired in some applications, particularly in warm weather climates. Solar factor (SF), calculated in accordance with EN standard 410, relates to a ratio between the total energy entering a room or the like through a glazing and the incident solar energy. Thus, it will be appreciated that lower SF values are indicative of good solar protection against undesirable heating of rooms or the like protected by windows/glazings. A low SF value is indicative of a coated article (e.g., IG window unit) that is capable of keeping a room fairly cool in summertime months during hot ambient conditions. Thus, low SF values are sometimes desirable in hot environments. High light-to-solar gain (LSG) values are also desirable. LSG is calculated as $T_{vis}$/SHGC. The higher the LSG value, the more visible light that is transmitted and the less amount of heat that is transmitted by the coated article. While low SF and SHGC values, and high LSG values, are sometimes desirable for coated articles such as IG window units and/or monolithic windows, the achievement of such values may come at the expense of sacrificing coloration and/or reflectivity values. In particular, conventional attempts to achieve low SF and SHGC values have often resulted in undesirably high visible reflectance value(s) and/or undesirable visible coloration of the coating. Thus, conventional low-E coatings designed for monolithic window applications typically cannot be used to provide low visible transmission (e.g., 15-36%), low SHGC performance absent the use of deeply tinted glass substrates. It is often desirable, but difficult, to achieve a combination of acceptable visible transmission (TY or $T_{vis}$), desirable reflective coloration (e.g., desirable a* and b* reflective color values), low SF, low SHGC, and high LSG for a coated article in window applications, especially if it desired to use a glass substrate that is not deeply tinted.

SF (G-Factor; EN410-673 2011) and SHGC (NFRC-2001) values are calculated from the full spectrum ($T_{vis}$, Rg and Rf) and are typically measured with a spectrophotometer such as a Perkin Elmer 1050. The SF measurements are done on monolithic coated glass, and the calculated values can be applied to monolithic, IG and laminated applications.

Solar control coatings are known in the art. For example, solar control coatings having a layer stack of glass/$Si_3N_4$/NiCr/$Si_3N_4$/NiCr/$Si_3N_4$ are known in the art, where the NiCr layer may be nitrided. For example, see U.S. Patent Document 2012/0177899 which is hereby incorporated herein by reference. While layer stacks of U.S. Patent Document 2012/0177899 provide reasonable solar control and are overall good coatings, they are lacking in certain respects. The glass side reflective a* values (a* under $R_GY$) in Examples 1, 4 and 5 in paragraphs 0025-0026 of US '899 are −17.8, −15.95, and +2.22, respectively, and the glass side visible reflectance values ($R_GY$) in Examples 1, 4 and 5 are 36%, 36.87%, and 15.82%, respectively. Examples 1 and 4 in US '899 are undesirable because the glass side visible reflectance ($R_GY$) values are too high at 36% and 36.87%, respectively, and because the glass side reflective a* values are too negative at −17.8 and −15.95, respectively. And when $R_GY$ is reduced down to 15.82% in Example 5, this results in the glass side reflective a* color value in Example 5 becoming too red with a value of +2.22. Thus, the coatings described in US '899 were not able to achieve a combination of acceptable visible reflectivity values and reflective a* coloration values.

Certain known solar control coatings use NbN, NbZr, or NbZrN as IR reflecting layers. For instance, see U.S. Patent Document 2012/0177899 and U.S. Pat. No. 8,286,395. However, the instant inventors have surprisingly found that solar control coatings that use solely these materials NbN, NbZr, or NbZrN for IR reflecting layers are lacking in terms of normal emissivity ($E_n$) for a given IR reflecting layer(s) thickness. For a given IR reflecting layer(s) thickness, the instant inventors have found that such coatings have undesirably high normal emittance ($E_n$) values, undesirably high SHGC values; and undesirably low LSG values.

It would be desirable according to example embodiments of this invention for a coating to be designed so as to have a combination of acceptable visible transmission (TY or $T_{vis}$), desirable reflective coloration (e.g., desirable a* and b* reflective color values), low SF, low SHGC, and high LSG for a coated article in window applications. Note that as visible transmission increases parameters such as SF and SHGC will also increase, and $E_n$ will decrease, with this being based on the desired transmission for instance of a given coated article for a given application. Coated articles according to example embodiments of this invention substantially reduce the red interior reflective color (e.g., film side reflective red color) while retaining a low interior visible reflectance, while maintaining good mechanical, chemical and environmental durability and low emissivity properties.

In certain example embodiments of this invention, certain applications such as monolithic window applications desire reflective coloration that is not significantly red. In other words, certain applications such as monolithic window applications desire reflective a* color values that are either negative or no greater than +1.6 or +1.0 (reflective a* values higher than +1.6 are undesirably red). Such reflective a* values are desirable in the context of glass side reflective ($R_{G[or\ outside,\ or\ exterior]}Y$) and/or film side reflective ($R_{F[or\ inside]}Y$) a* values.

Certain embodiments of this invention relate to coated articles that include two or more functional infrared (IR) reflecting layers sandwiched between at least dielectric layers, and/or a method of making the same. The dielectric layers may be of or include silicon nitride or the like. In certain example embodiments, at least one of the IR reflecting layers is of or including titanium nitride (e.g., TiN) and at least another of the IR reflecting layers is of or including NiCr (e.g., NiCr, NiCrN$_x$, NiCrMo, and/or NiCrMoN$_x$). It has surprisingly and unexpectedly been found that the use of these different materials for the different IR reflecting layers (e.g., as opposed to using TiN for both IR reflecting layers) in a given solar control coating surprisingly results in improved optics such as improved reflective a* values and/or reduced visible reflectivity values which are often desirable characteristics in window applications, and the provision of the IR reflecting layer of or including NiCr allows coated articles to be more easily tailored for desired visible transmission values while the IR reflecting layer of or including TiN can keep the normal emissivity, SF and/or SHGC values reasonably low. Coating according to embodiments of this invention may be designed so that before and/or after any optional heat treatment such as thermal tempering the coated articles realize one or more of: desirable glass side and/or film side reflective visible coloration that is not too red (e.g., reflective a* color value(s) from −8 to +1.6); a desirably low solar heat gain coefficient (SHGC); desirable visible transmission (TY or T$_{vis}$); thermal stability upon optional heat treatment (HT) such as thermal tempering; desirably low normal emissivity/emittance (E$_n$); and/or desirably high light-to-solar gain ratio (LSG). Such coated articles may be used in the context of monolithic windows, insulating glass (IG) window units, laminated windows, and/or other suitable applications.

In certain example embodiments of this invention, there is provided a coated article including a coating supported by a glass substrate, the coating comprising: a first dielectric layer comprising silicon nitride; a first infrared (IR) reflecting layer comprising NiCr on the glass substrate over at least the first dielectric layer comprising silicon nitride; a second dielectric layer comprising silicon nitride on the glass substrate over at least the first dielectric layer comprising silicon nitride and the first IR reflecting layer comprising NiCr; a second layer IR reflecting layer comprising a nitride of titanium on the glass substrate over at least the second dielectric layer comprising silicon nitride; a third dielectric layer comprising silicon nitride on the glass substrate over at least the second IR reflecting layer comprising the nitride of titanium; wherein the coating contains no IR reflecting layer based on silver; and wherein the coated article has: a visible transmission from about 12-70%, a glass side visible reflectance no greater than about 16%, a film side visible reflectance no greater than about 16%, a glass side reflective a* value of from −8 to +1.6, a film side reflective a* color value of from −8 to +1.6.

In certain example embodiments of this invention there is provided a coated article including a coating supported by a glass substrate, the coating comprising: a first dielectric layer; a first infrared (IR) reflecting layer on the glass substrate over at least the first dielectric layer; a second dielectric layer comprising silicon nitride on the glass substrate over at least the first dielectric and the first IR reflecting layer; a second layer IR reflecting layer comprising a nitride of titanium on the glass substrate over at least the second dielectric layer comprising silicon nitride; a third dielectric layer on the glass substrate over at least the second IR reflecting layer comprising the nitride of titanium; wherein the coating contains no IR reflecting layer based on silver; and wherein the coated article has: a visible transmission from about 12-70%, a glass side visible reflectance no greater than about 16%, a film side visible reflectance no greater than about 16%, a glass side reflective a* value of from −8 to +1.6, and a film side reflective a* color value of from −8 to +1.6.

In certain example embodiments of this invention, there is provided a method of making a coated article including a coating supported by a glass substrate, the method comprising: sputter-depositing a first dielectric layer comprising silicon nitride; sputter-depositing a first infrared (IR) reflecting layer comprising NiCr on the glass substrate over at least the first dielectric layer comprising silicon nitride; sputter-depositing a second dielectric layer comprising silicon nitride on the glass substrate over at least the first dielectric layer comprising silicon nitride and the first IR reflecting layer comprising NiCr; sputter-depositing a second layer IR reflecting layer comprising a nitride of titanium on the glass substrate over at least the second dielectric layer comprising silicon nitride; and sputter-depositing a third dielectric layer comprising silicon nitride on the glass substrate over at least the second IR reflecting layer comprising the nitride of titanium; wherein the coating contains no IR reflecting layer based on silver; and wherein the coated article has a visible transmission from about 12-70% and one or more of: (a) a glass side visible reflectance no greater than about 16%, (b) a film side visible reflectance no greater than about 16%, (c) a glass side reflective a* value of from −8 to +1.6, and (d) a film side reflective a* color value of from −8 to +1.6.

Thus, this invention covers monolithic window units, IG window units, laminated window units, and any other article including a glass substrate having a coating thereon as claimed. Note that monolithic measurements may be taken by removing a coated substrate from an IG window unit and/or laminated window unit, and then performing monolithic measurements. It is also noted that for a given coating the SF and SHGC values will be significantly higher for a monolithic window unit than for an IG window unit with the same coated article.

DETAILED DESCRIPTION OF CERTAIN EXAMPLE EMBODIMENTS OF THE INVENTION

Referring now more particularly to the accompanying drawings in which like reference numerals indicate like parts throughout the several views.

A coating 8 is designed so as to have a combination of acceptable visible transmission (TY or T$_{vis}$), desirable reflective coloration (e.g., desirable a* and b* reflective color values), low SF, low SHGC, and high LSG for a coated article for use in window applications or the like. As visible transmission increases when the IR reflecting layer(s) become thinner, parameters such as SF and SHGC will also increase, and E$_n$ will decrease, with this being based on the desired transmission for instance of a given coated article for a given application. Example applications include architectural windows, residential windows, monolithic windows, automotive windows, and/or IG windows.

Certain embodiments of this invention relate to coated articles having a coating 9 on a glass substrate 1, where the coating includes two or more functional infrared (IR) reflecting layers 3 and 5 sandwiched between at least dielectric layers 2, 4, 6, 7, and/or a method of making the same. The dielectric layers 2, 4 and 6 may be of or include silicon nitride or the like. Transparent dielectric overcoat 7, of or including zirconium oxide or any other suitable material, is optional. In certain example embodiments, at least one of the IR reflecting layers is of or including titanium nitride (e.g., TiN) and at least another of the IR reflecting layers is of or including NiCr (e.g., NiCr, NiCrN$_x$, NiCrMo, and/or NiCrMoN$_x$). In the FIG. 1 embodiment, upper IR reflecting layer 5 is of or including titanium nitride (e.g., TiN) and lower IR reflecting layer 3 is of or including NiCr (e.g., NiCr, NiCrN$_x$, NiCrMo, and/or NiCrMoN$_x$). It has surprisingly and unexpectedly been found that the use of these different materials for the different IR reflecting layers 3 and 5 (e.g., as opposed to using TiN for both IR reflecting layers 3 and 5) in a given solar control coating surprisingly results in improved optics such as improved reflective a* values and/or reduced visible reflectivity values which are often desirable characteristics in window applications, and the provision of the IR reflecting 3 layer of or including NiCr allows coated articles to be more easily tailored for desired visible transmission values while the IR reflecting layer of or including TiN 5 provides for desirably low normal emissivity, SF and/or SHGC values for a given thickness of IR reflecting material. Coating 8 according to embodiments of this invention may be designed so that before and/or after any optional heat treatment such as thermal tempering the coated articles realize one or more of: desirable glass side and/or film side reflective visible coloration that is not too red (e.g., reflective a* color value(s) from −8 to +1.6); a desirably low solar heat gain coefficient (SHGC); desirable visible transmission (TY or T$_{vis}$); thermal stability upon optional heat treatment (HT) such as thermal tempering; desirably low E$_n$; and/or a desirably high light-to-solar gain ratio (LSG). In example embodiments of this invention, the coating 8 contains no IR reflecting layer based on Ag or Au.

In certain example embodiments of this invention, certain applications such as monolithic window applications desire reflective coloration that is not significantly red. In other words, certain applications such as monolithic window applications desire reflective a* color values that are either negative or no greater than +1.6 (reflective a* values higher than +1.6 are undesirably red). Such reflective a* values are not too red and are desirable in the contact of glass side reflective (R$_G$Y) and/or film side reflective (RFY) a* values.

Coated articles may optionally be heat treated in certain example embodiments of this invention, and are preferably designed to be heat treatable. The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes. The coated article may or may not be heat treated in different embodiments of this invention.

Figure 1:
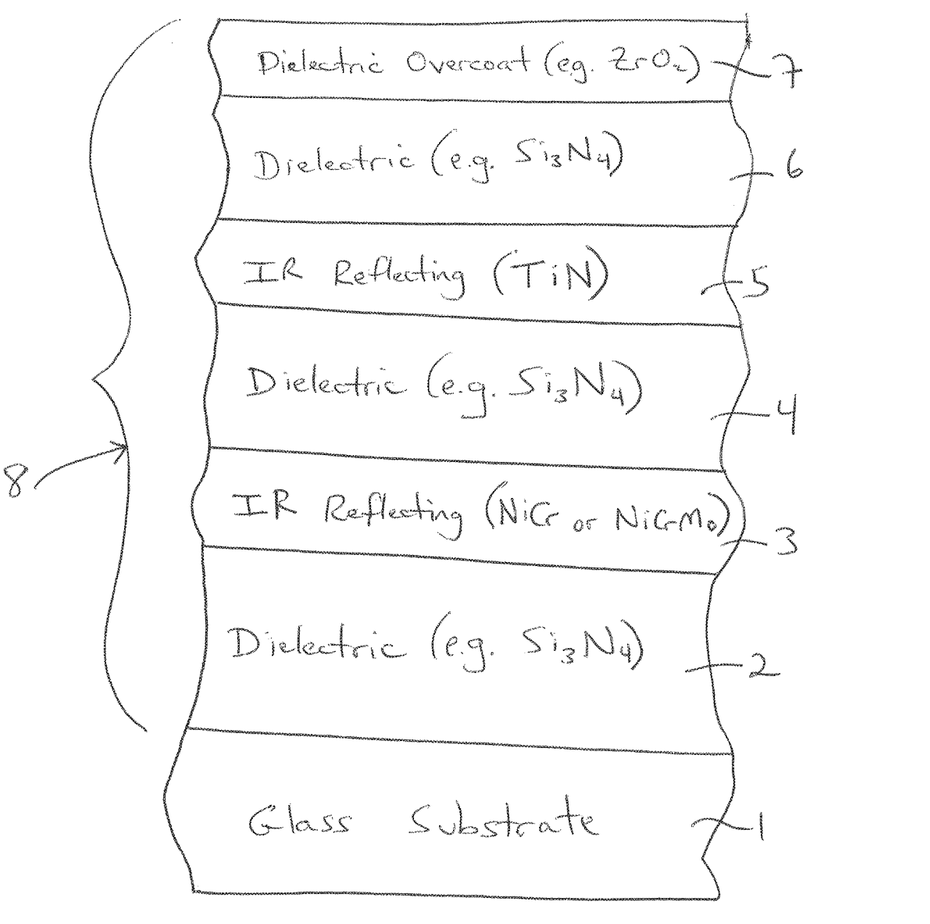
FIG. 1 is a partial cross sectional view of a monolithic coated article (heat treated or not heat treated) according to an example embodiment of this invention.

FIG. 1 is a cross sectional view of a coated article according to an example embodiment of this invention. In the FIG. 1 embodiment the solar control coating 8 includes two IR reflecting layers 3 and 5, and transparent dielectric layers 2, 4, 6 and 7. The coated article includes at least glass substrate 1 (e.g., clear, green, bronze, grey, blue, or blue-green glass substrate from about 1.0 to 12.0 mm thick, more preferably from 4-8 mm thick, with an example glass substrate thickness being 6 mm), transparent dielectric layers 2, 4, 6 (e.g., of or including silicon nitride [e.g., Si$_3$N$_4$], silicon oxynitride, silicon zirconium nitride, or some other suitable dielectric), IR reflecting layers 3, 5. It will be appreciated that the IR reflecting layers 3 and/or 5 may be nitrided in certain example embodiments of this invention. Upper IR reflecting layer 5 is of or including titanium nitride (e.g., TiN, preferably a stoichiometric or substantially stoichiometric type) and lower IR reflecting layer 3 is of or including NiCr (e.g., NiCr, NiCrN$_x$, NiCrMo, and/or NiCrMoN$_x$). The NiCr may be with respect to metal content about Ni(80)/Cr(20) by weight percent, or any other suitable ratio. The lower absorbing IR reflecting layer 3 (e.g., of or including NiCr-based metal or NiCr-based nitride) preferably has a refractive index (n) from about 2.2-2.4 (at 550 nm) and an extinction coefficient (k) from about 2.3-4.0 (at 550 nm). This has surprisingly been found to provide for lower glass and film side visible reflectance and reduced reddish film side reflective color in the final product. The upper IR reflecting layer 5 is of or includes TiN$_x$ in certain example embodiments of this invention, where x is preferably from 0.8 to 1.2, more preferably from 0.9 to 1.1, with an example value being about 1.0. These "x" values provide for improved/lowered emittance values compared to if "x" is too low for instance. It has surprisingly and unexpectedly been found that the use of these different materials for the different IR reflecting layers 3 and 5 (e.g., as opposed to using TiN for both IR reflecting layers 3 and 5) in a given solar control coating provides for surprisingly results as explained herein. While the IR reflecting layers may include some small amount of oxygen in certain instances, it is preferable that these layers 3 and 5 are substantially free of oxygen such as no more than 8% oxygen, more preferably no more than about 5% oxygen, and most preferably no more than about 3% or 2% oxygen in certain embodiments (atomic %). The coated article may optionally include transparent dielectric overcoat layer 7 of or including a protective material such as zirconium oxide (e.g., ZrO$_2$) or silicon oxynitride. Optionally, a dielectric layer of or including silicon oxynitride and/or zirconium silicon oxynitride of any suitable stoichiometry may be located between and contacting layers 6 and 7 in the upper part of the layer stack in certain example embodiments. In certain example embodiments of this invention, coating 8 does not include any metallic IR blocking or reflecting layer of or based on Ag or Au. In certain example embodiments of this invention, IR reflecting layers 3 and 5 reflect at least some IR radiation, and do not contact any other metal or metal based IR reflecting layer. In certain example embodiments, it is possible for each of the layers to include other materials such as dopants. It will be appreciated of course that other layers may also be provided, or certain layers may be omitted, and different materials may be used, in certain alternative embodiments of this invention.

The overall coating 8 of FIG. 1 includes at least the illustrated layers in certain example embodiments, with layer 7 in particular being optional. It is noted that the terms "oxide" and "nitride" as used herein include various stoichiometries. For example, the term silicon nitride (for one or more of layers 2, 4, 6) includes stoichiometric Si$_3$N$_4$, as well as non-stoichiometric silicon nitride, and these layers may be doped with other material(s) such as Al and/or O. The illustrated layers may be deposited on glass substrate 1 via magnetron sputtering, any other type of sputtering, or via any other suitable technique in different embodiments of this invention. It is noted that other layer(s) may be provided in the stack shown in FIG. 1 such as between layers 2 and 3, or between layers 3 and 4, or between the substrate 1 and layer 2, or the like. Generally, other layer(s) may also be provided in other locations of the coating. Thus, while the coating 8 or layers thereof is/are "on" or "supported by"

substrate 1 (directly or indirectly), other layer(s) may be provided therebetween. Thus, for example, the layer system 8 and layers thereof shown in FIG. 1 are considered "on" the substrate 1 even when other layer(s) may be provided therebetween (i.e., the terms "on" and "supported by" as used herein are not limited to directly contacting). However, there may be the direct contacts shown in FIG. 1 in preferred embodiments.

In certain example embodiments of this invention, dielectric layers 2, 4, and 6 may each have an index of refraction "n" of from 1.7 to 2.7 (at 550 nm), more preferably from 1.9 to 2.5 in certain embodiments, and most preferably from about 2.0 to 2.06 in preferred embodiments of this invention. One, two, three, or all of these layers 2, 4, 6 may be of or include silicon nitride and/or silicon oxynitride in certain example embodiments of this invention. In such embodiments of this invention where layers 2, 4, 6 comprise silicon nitride (e.g., $Si_3N_4$), sputtering targets including Si employed to form these layers may or may not be admixed with up to 1-20% (e.g., 8%) by weight aluminum or stainless steel (e.g. SS#316), with about this amount then appearing in the layers so formed. Even with this amount(s) of aluminum and/or stainless steel, such layers are still considered dielectric layers. In certain example embodiments, each of the IR reflecting layers 3 and 5 is provided between respective nitride layers (e.g., silicon nitride based layers 2, 4, 6) in order to reduce or prevent oxidation of the IR reflecting layers during possible heat treatment (e.g., thermal tempering, heat bending, and/or heat strengthening) thereby permitting predictable coloration to be achieved following the heat treatment at multiple viewing angles. While FIG. 1 illustrates a coated article according to an embodiment of this invention in monolithic form, coated articles according to other embodiments of this invention may comprise IG (insulating glass) window units or the like.

Turning back to the FIG. 1 embodiment, various thicknesses may be used consistent with one or more of the needs discussed herein. According to certain example embodiments of this invention, example thicknesses (in angstroms) and materials for the respective layers of the FIG. 1 embodiment on the glass substrate 1 are as follows in certain example embodiments for achieving desired transmission, reflective coloration, and visible reflectance in combination with a desirably low SF and/or SHGC value(s) and/or a desirably high LSG value (layers are listed in order moving away from the glass substrate 1):

TABLE 1

(Thicknesses in FIG. 1 embodiment)

| Layer | Example Range (Å) | Preferred (Å) | Example (Å) |
|---|---|---|---|
| silicon nitride (layer 2): | 20-500 Å | 40-200 Å | 50 Å |
| IR reflector (e.g., NiCr) (layer 3): | 5-150 Å | 40-85 Å | 68 Å |
| silicon nitride (layer 4): | 200-1100 Å | 400-900 Å | 723 Å |
| IR reflector (e.g., TiN) (layer 5): | 50-450 Å | 130-300 Å | 268 Å |
| silicon nitride (layer 6): | 10-700 Å | 140-300 Å | 171 Å |
| overcoat (e.g., $ZrO_2$) (layer 7): | 10-150 Å | 20-40 Å | 30 Å |

Table 1 above relates to, for example, embodiments where coating 8 is designed so that before and/or after any optional heat treatment such as thermal tempering the coated articles realize one, two, three, four, five or all six of: desirable glass side and/or film side reflective visible coloration such as not too red reflective color (e.g., reflective a* color value(s) from −8 to +1.6); a desirably low SHGC; desirable visible transmission; thermal stability upon optional HT such as thermal tempering; desirably low $E_n$; and/or a desirably high LSG. In certain example embodiments, upper IR reflecting layer 5 is physically thicker than lower IR reflecting layer by at least 50 angstroms (Å), more preferably by at least 100 Å, and sometimes by at least 150 Å. It has been found that this thickness difference surprisingly results in the normal emittance being desirably low in combination with reflective * value(s) being desirably neutral and visible reflectance values being desirably low. In certain example embodiments of this invention, center dielectric layer 4 is physically thicker than each of dielectric layers 2 and 6 by at least 50 angstroms (Å), more preferably by at least 100 Å, and sometimes by at least 300 Å, in order to provide for improved coloration and/or reflectance values especially in low visible transmission applications.

Before and/or after any optional heat treatment (HT) such as thermal tempering, in certain example embodiments of this invention coated articles according to the FIG. 1 embodiment have color/optical characteristics as follows in Table 2 (measured monolithically). It is noted that subscript "G" stands for glass side reflective, subscript "T" stands for transmissive, and subscript "F" stands for film side reflective. As is known in the art, glass side (G) means when viewed from the glass side (as opposed to the layer/film side) of the coated article. Film side (F) means when viewed from the side of the coated article on which the coating is provided. Table 3 set forth below illustrates certain characteristics of coated articles according to certain example embodiments of this invention after HT such as thermal tempering (monolithically measured for Table 3). The characteristics below in Table 2 are in accordance with Illuminant C, 2 degree Observer, and are applicable to HT and non-HT coated articles herein, except that the thermal stability data in Table 3 relates to HT coated articles and demonstrates the stability upon HT. Glass side reflective and/or film side reflective coloration may be such that coated articles appear neutral colored, blue-green colored, or yellow-green colored in various example embodiments of this invention.

TABLE 2

Color/Optical Characteristics (FIG. 1 embodiment monolithic)

| | General | Preferred | Most Preferred |
|---|---|---|---|
| $T_{vis}$ (TY): | 12-70% | 15-60% | 15-50% (or 15-36%) |
| $L^*_T$ | 25-90 | 35-80 | 40-60 |
| $a^*_T$ | −10 to +5 | −8 to +2 | −6 to 0 |
| $b^*_T$ | −15 to +7 | −10 to +3 | −9 to 0 |
| $R_GY$(glass side): | ≤16% | ≤14% | ≤11% (or ≤10%) |
| $L^*_G$ | 22-55 | 25-45 | 30-42 |
| $a^*_G$ | −8 to +1.6 | −6 to +1 | −3 to +1 |
| $b^*_G$ | −14 to +9 | −9 to +4 | −8 to 0 |
| $R_FY$(film side): | ≤16% | ≤14% | ≤12% (or ≤10%) |
| $a^*_F$ | −8 to +1.6 | −6 to +1 | −3 to +1 |
| $b^*_F$ | −14 to +9 | −9 to +4 | −8 to 0 |
| $E_n$: | ≤0.50 (or ≤0.40) | ≤0.36 | ≤0.28 (or ≤0.26; or ≤0.25) |
| SHGC: | ≤0.52 | ≤0.41 | ≤0.35 (or ≤0.30; or ≤0.28) |
| LSG: | ≥0.50 | ≥0.60 | ≥0.80 (or ≥1.00) |

TABLE 3

Thermal Stability (FIG. 1 after HT; in addition to Table 2)

|  | General | Preferred | Most Preferred |
|---|---|---|---|
| $\Delta E^*_G$ | <=4.0 | <=3.5 | <=3.0 |

For purposes of example only, Examples 1-14 representing different example embodiments of this invention, as well we Comparative Examples (CE) 1-3, are set forth below.

EXAMPLES

Comparative Examples (CEs) 1-3 and Examples 1, 6, and 7 were sputter-deposited (as all examples) layer stacks modeled on 4 mm thick clear glass substrates. Examples 2, 8 and 12 were layer stacks modeled on 4 mm thick green glass substrates. Examples 3 and 9 were layer stacks modeled on 4 mm thick deep green SMG-III glass substrates. Examples 4, 10 and 13 were layer stacks modeled on 4 mm thick crystal grey glass substrates. And Examples 5, 11 and 14 were layer stacks modeled on 4 mm thick grey glass substrates. Thus, Examples 2-5 for instance are essentially the same coating, but on different colored glass substrates 1. Different thicknesses of various layers in the examples are designed for different desired visible transmission applications. The optical measurements are monolithic measurements. Optical data for CEs 1-3 and Examples 1-11 is in accordance with Illuminant C, 2 degree Observer, and for Examples 12-14 is in accordance with D65 10 degree Observer, unless indicated otherwise. The silicon nitride layers in each example were doped with about 8% Al. The TiN layers were approximately stoichiometric, and the NiCr layers were 80/20 Ni/Cr, which of course can be nitrided. Layer thicknesses are in angstroms (Å). "L" in Table 4 below stand for Layer (e.g., L2 means layer 2 shown in FIG. 1, L3 means layer 3 shown in FIG. 1, and so forth). Note that Comparative Examples 1-3 (CEs 1-3) used TiN, instead of NiCr, for purposes of comparison. It will be shown below that the use of NiCr for layer 3 in Examples 1-14 provided for unexpectedly improved optics compared to the use of TiN for layer 3 in CEs 1-3.

TABLE 4

Layer Stacks of Examples

| Example | L2(Si$_3$N$_4$) | L3(NiCr) or L3(TiN) | L4(Si$_3$N$_4$) | L5(TiN) | L6(Si$_3$N$_4$) | L7(ZrO$_2$) |
|---|---|---|---|---|---|---|
| CE 1: | 220 | n/a | 240 | 670 | 310 | 10 | 40 |
| CE 2: | 140 | n/a | 200 | 590 | 240 | 30 | 40 |
| CE 3: | 40 | n/a | 180 | 350 | 120 | 30 | 40 |
| Ex. 1: | 50 | 68 | n/a | 723 | 268 | 171 | 30 |
| Exs. 2-5: | 50 | 66 | n/a | 714 | 261 | 206 | 30 |
| Ex. 6: | 50 | 49 | n/a | 746 | 235 | 158 | 30 |
| Ex. 7: | 50 | 11 | n/a | 385 | 138 | 281 | 30 |
| Exs. 8-9: | 50 | 10 | n/a | 482 | 140 | 438 | 30 |
| Exs. 10-11: | 50 | 10 | n/a | 427 | 140 | 438 | 30 |
| Ex. 12: | 132 | 79 | n/a | 703 | 285 | 230 | 30 |
| Exs. 13-14: | 50 | 66 | n/a | 714 | 261 | 206 | 30 |

TABLE 5

Measured Monolithic Optical Data (CEs 1-3 & Examples 1-2)

| Parameter | CE 1 | CE 2 | CE 3 | Ex. 1 | Ex. 2 |
|---|---|---|---|---|---|
| T$_{vis}$ (TY)(transmission): | 18.6% | 24.2% | 35.3% | 23.1% | 21.8% |
| L*$_T$: | 50.2 | 56.3 | 66.0 | 55.2 | 53.8 |
| a*$_T$: | -7.2 | -7.0 | -5.5 | -3.15 | -5.86 |
| b*$_T$: | -4.3 | -1.5 | -0.8 | -8.27 | -7.97 |
| R$_G$Y(glass side refl. %): | 9.5% | 9.2% | 13.0% | 12.0% | 9.6% |
| L*$_G$: | 36.9 | 36.4 | 42.8 | 41.2 | 37.1 |
| a*$_G$: | -3.2 | -2.8 | -0.3 | -0.8 | -1.45 |
| b*$_G$: | -3.5 | 0.4 | -5.7 | -1.8 | -2.1 |
| R$_F$Y(film side refl. %): | 25.2% | 19.1% | 10.8% | 14.1% | 11.2% |
| L*$_F$: | 57.3 | 50.8 | 39.2 | 44.4 | 39.9 |
| a*$_F$: | 5.3 | 4.7 | 7.0 | 0.6 | -0.3 |
| b*$_F$: | -8.3 | -6.1 | -5.4 | -4.9 | -4.1 |
| E$_n$: | 0.18 | 0.25 | 0.36 | 0.25 | 0.25 |
| SHGC (NFRC-2001): | 0.21 | 0.24 | 0.31 | 0.28 | 0.27 |
| LSG: | 0.80 | 1.01 | 1.14 | 0.83 | 0.81 |

It can be seen from Table 5, comparing CEs 1-3 with Examples 1-2, that the use of NiCr in Examples 1-2 (instead of TiN in CEs 1-3) for layer 3 provided for unexpected results. For instance, the film side reflective a* values (a*F) in CEs 1-3 were too red with values of +5.3, +4.7, and +7.0, respectively. The use of NiCr for layer 3 in Examples 1-2 (instead of TiN in CEs 1-3) unexpectedly shifted the film side reflective a* (a*F) values to acceptable values of 0.6 and -0.3, respectively, thereby resulting in not too red coatings as viewed from the film side which are more aesthetically pleasing especially in applications such as monolithic window applications. Additionally, the film side visible reflectance values of CEs 1-2 were too high at 25.2% and 19.1%, respectively. The use of NiCr for layer 3 in Examples 1-2 (instead of TiN in CEs 1-2) unexpectedly shifted the film side visible reflectance vales to more acceptable and aesthetically pleasing 14.1% and 11.2%, respectively. Moreover, the use of TiN for layer 5 allowed E$_n$ to remain in an acceptable range (whereas that would not have occurred if NiCr had been used for both IR reflecting layers 3 and 5). It is noted that CEs 1-2 are readily comparable to Examples 1-2 because they have similar visible transmission values.

Measured monolithically after thermal tempering (HT), Examples 3-7 had the following characteristics. Examples Measured monolithically after thermal tempering (HT), the CEs and Examples has the following characteristics.

3-7 confirm the unexpected results demonstrated above by using NiCr for layer 3 (instead of TiN in CEs 1-3).

TABLE 6

Measured Monolithic Optical Data (Examples 3-7)

| Parameter | Ex. 3 | Ex. 4 | Ex. 5 | Ex. 6 | Ex. 7 |
|---|---|---|---|---|---|
| $T_{vis}$ (TY)(transmission): | 20.2% | 19.7% | 15.5% | 29.5% | 56.8% |
| $L^*_T$: | 52.1 | 51.5 | 46.3 | 61.2 | 80.1 |
| $a^*_T$: | -7.2 | -2.8 | -1.6 | -3.2 | -2.1 |
| $b^*_T$: | -6.7 | -9.1 | -8.3 | -5.9 | -2.1 |
| $R_GY$(glass side refl. %): | 8.9% | 8.6% | 7.1% | 10.1% | 9.9% |
| $L^*_G$: | 35.8 | 35.2 | 32.0 | 38.0 | 37.7 |
| $a^*_G$: | -2.4 | 0.9 | 1.12 | -0.4 | -5.5 |
| $b^*_G$: | -1.1 | -3.2 | -2.3 | -0.7 | -1.6 |
| $R_FY$(film side refl. %): | 11.1% | 11.1% | 11.0% | 15.7% | 9.6% |
| $L^*_F$: | 39.7 | 39.7 | 39.6 | 46.6 | 37.1 |
| $a^*_F$: | -0.3 | -0.2 | -0.1 | -0.2 | -0.5 |
| $b^*_F$: | -4.2 | -3.9 | -4.2 | -0.4 | 1.5 |
| $E_n$: | 0.25 | 0.25 | 0.25 | 0.27 | 0.36 |
| SHGC (NFRC-2001): | 0.26 | 0.27 | 0.26 | 0.32 | 0.51 |
| LSG: | 0.77 | 0.72 | 0.60 | 0.92 | 1.10 |

Measured monolithically after thermal tempering (HT), Examples 8-12 had the following characteristics. Examples 8-12 confirm the unexpected results demonstrated above by using NiCr for layer 3 (instead of TiN in CEs 1-3).

TABLE 7

Measured Monolithic Optical Data (Examples 8-12)

| Parameter | Ex. 8 | Ex. 9 | Ex. 10 | Ex. 11 | Ex. 12 |
|---|---|---|---|---|---|
| $T_{vis}$ (TY)(transmission): | 54.4% | 50.2% | 49.0% | 38.3% | 19.4% |
| $L^*_T$: | 78.7 | 76.2 | 75.5 | 68.2 | 51.2 |
| $a^*_T$: | -7.1 | -8.9 | -2.7 | -1.2 | -6.5 |
| $b^*_T$: | -0.8 | 0.6 | -2.7 | -2.1 | -9.3 |
| $R_GY$(glass side refl. %): | 7.9% | 7.5% | 8.3% | 7.0% | 9.7% |
| $L^*_G$: | 33.8 | 32.9 | 34.6 | 31.8 | 37.3 |
| $a^*_G$: | -0.9 | -1.6 | -1.6 | -0.7 | 0.8 |
| $b^*_G$: | 0.4 | 0.6 | 3.3 | 2.0 | -5.0 |
| $R_FY$(film side refl. %): | 3.5% | 3.3% | 3.3% | 2.9% | 8.8% |
| $L^*_F$: | 21.9 | 21.2 | 21.2 | 19.6 | 35.6 |
| $a^*_F$: | 1.1 | 0.9 | 0.3 | 0.6 | -0.4 |
| $b^*_F$: | -1.6 | -1.5 | -2.0 | -2.5 | -4.4 |
| $E_n$: | 0.36 | 0.36 | 0.36 | 0.36 | 0.24 |
| SHGC (NFRC-2001): | 0.44 | 0.40 | 0.46 | 0.43 | 0.26 |
| LSG: | 1.25 | 1.25 | 1.05 | 0.88 | 0.80 |

Measured monolithically after thermal tempering (HT), Examples 13-14 had the following characteristics. Examples 13-14 confirm the unexpected results demonstrated above by using NiCr for layer 3 (instead of TiN in CEs 1-3).

TABLE 8

Measured Monolithic Optical Data (Examples 13-14)

| Parameter | Ex. 13 | Ex. 14 |
|---|---|---|
| $T_{vis}$ (TY)(transmission): | 19.9% | 15.5% |
| $L^*_T$: | 51.7 | 46.3 |
| $a^*_T$: | -3.6 | -2.1 |
| $b^*_T$: | -8.8 | -8.1 |
| $R_GY$(glass side refl. %): | 8.6% | 7.1% |
| $L^*_G$: | 35.2 | 32.0 |
| $a^*_G$: | 1.4 | 1.6 |
| $b^*_G$: | -3.9 | -2.9 |
| $R_FY$(film side refl. %): | 11.3% | 11.2% |
| $L^*_F$: | 40.1 | 39.9 |
| $a^*_F$: | -2.0 | -2.0 |
| $b^*_F$: | -3.1 | -3.3 |
| $E_n$: | 0.25 | 0.25 |
| SHGC (NFRC-2001): | 0.27 | 0.26 |
| LSG: | 0.77 | 0.64 |

Again, in addition to the comparison above between CEs 1-3 and Examples 1-2, it can be seen also by comparing Examples 3-14 with CEs 1-3 that the use of NiCr in Examples 3-14 (instead of TiN in CEs 1-3) for layer 3 provided for unexpected results. For instance, the film side reflective a* values (a*F) in CEs 1-3 were too red with values of +5.3, +4.7, and +7.0, respectively. The use of NiCr for layer 3 in Examples 1-14 (instead of TiN in CEs 1-3) unexpectedly shifted the film side reflective a* (a*F) values to acceptable values within the range of −8 to +1.6, thereby resulting in not too red coatings as viewed from the film side which are more aesthetically pleasing. Additionally, the film side visible reflectance values of CEs 1-2 were too high at 25.2% and 19.1%, respectively. The use of NiCr for layer 3 in Examples 1-14 (instead of TiN in CEs 1-2) unexpectedly shifted the film side visible reflectance vales to more acceptable and aesthetically pleasing values no greater than 16%. Moreover, the use of TiN for layer 5 allowed $E_n$ to remain in an acceptable range (whereas that would not have occurred if NiCr had been used for both IR reflecting layers 3 and 5). In Examples 1-11 for example, it can be seen that film side reflective a* color is aesthetically acceptable with a maximum value around +1 (barely red). Overall film side reflective coloration varies between light greenish blue to light violet-blue, while at the same time film side visible reflectance remains desirably low ranging between 3% and 16% regardless of light transmission value. Glass side visible reflectance also remains fairly low across all transmission ranges, and glass side reflective color varies from neutral to blue-green to yellowish green except when placed on grey tinted glass where the has a light gray appearance. These are medium spectrally selective products, with SHGC (NFRC-2001) ranging from about 0.25 for low visible transmission designs to about 0.5 for high visible transmission designs. Normal emissivity varies from about 0.25 and about 0.40. LSG varies from about 0.6 for a low light transmission design on gray tinted glass to about 1.25 for high light transmission designs on green tinted glass. Thickness and substrate variations of the basic design can be made to achieve other desired transmissions, reflections, reflected color and thermal performance.

With respect to the automotive market, there is a need for privacy glass. Such products are used in the areas of light trucks (trucks, SUV's and cross over vehicles) where light transmission is allowed to be less than 70% behind the B-pillars of the vehicle. This market is supplied today with deep gray body tinted glass. The typical existing automotive privacy glass has a low visible light transmission (typically less than about 20%), very low outdoor reflectance (less than about 5%) as well as a transmitted and reflected color that appears to be a neutral gray. Coated articles according to example embodiments of this invention could be used in vehicle privacy glass applications, without necessarily needing deeply tinted glass substrates. Referring to Examples 12-14 above for example, coatings when deposited on standard green tinted glass (e.g., see Ex. 12) may have a visible light transmission of about 19%, and a glass and film side reflectance of about 9%, transmitted color is blue-green, glass side reflective color is light violet but appears as a blackish gray due to the low reflectance, film side color is a light greenish blue, and with an LSG of about 0.80 the coated article is more spectrally selective than conventional PrivaGuard deep grey body tinted glass conventionally used in such applications. Such applications can be advantageus, for example as green tinted glass substrates typically have a much lower cost to produce than do deeply grey body tinted PrivaGuard tinted glass substrate.

It is noted above that IR reflecting layer 3 may be of or include NiCrMo and/or $NiCrMoN_x$, in certain example embodiments of this invention. In such embodiments the IR reflecting layer 3 may, for example, be of or include C22 and/or a nitride thereof. Table 9 below shows an example composition of the NiCrMo-based alloy C22.

TABLE 9

NiCrMo based alloy C22 (wt. %)

| Element | Preferred | More Preferred | Example |
|---|---|---|---|
| Ni | 40-70% | 50-60% | 54-58% (e.g., 56%) |
| Cr | 5-40% | 10-30% | 20-22.5% |
| Mo | 5-30% | 10-20% | 12.5-14.5% |
| Fe | 0-15% | 0-10% | 1-5% (e.g., 3%) |
| W | 0-15% | 0-10% | 1-5% (e.g., 3%) |
| Co | 0-15% | 0-10% | 1-5% (e.g., 3%) |
| Si | 0-2% | 0-1% | =<0.2% (e.g., .08%) |
| Mn | 0-3% | 0-2% | =<1% (e.g., 0.5%) |
| C | 0-1% | 0-0.5% | =<0.1% (e.g., .01%) |
| V | 0-2% | 0-1% | =<1% (e.g., 0.35%) |

Moreover, it is noted above that IR reflecting layer 3 may be of or include NiCrMo and/or $NiCrMoN_x$, in certain example embodiments of this invention. In such embodiments the IR reflecting layer 3 may, for example, be of or include Inconel 686 and/or a nitride thereof. Table 10 below shows an example composition of the NiCrMo-based alloy Inconel 686.

TABLE 10

NiCrMo based alloy Inconel 686 (wt. %)

| Element | Preferred | More Preferred | Example |
|---|---|---|---|
| Ni | 40-70% | 50-62% | 54-60% (e.g., 58%) |
| Cr | 5-40% | 10-30% | 19-22.5% (e.g., 20.5%) |
| Mo | 5-30% | 12-20% | 14-18% (e.g., 16.3%) |
| Fe | 0-15% | 0-10% | 0.5-3% (e.g., 1.0%) |
| W | 0-15% | 0-10% | 1-5% (e.g., 3.8%) |

In an example embodiment of this invention, there is provided a coated article including a coating supported by a glass substrate, the coating comprising: a first dielectric layer comprising silicon nitride; a first infrared (IR) reflecting layer comprising NiCr on the glass substrate over at least the first dielectric layer comprising silicon nitride; a second dielectric layer comprising silicon nitride on the glass substrate over at least the first dielectric layer comprising silicon nitride and the first IR reflecting layer comprising NiCr; a second layer IR reflecting layer comprising a nitride of titanium on the glass substrate over at least the second dielectric layer comprising silicon nitride; a third dielectric layer comprising silicon nitride on the glass substrate over at least the second IR reflecting layer comprising the nitride of titanium; wherein the coating contains no IR reflecting layer based on silver; and wherein the coated article measured monolithically has: a visible transmission from about 12-70%, a glass side visible reflectance no greater than about 16%, a film side visible reflectance no greater than about 16%, a glass side reflective a* value of from −8 to +1.6, a film side reflective a* color value of from −8 to +1.6.

In the coated article of the immediately preceding paragraph, the coating contains only two IR reflecting layers in certain embodiments.

In the coated article of any of the preceding two paragraphs, the second dielectric layer comprising silicon nitride may be located between and directly contacting the first and second IR reflecting layers.

In the coated article of any of the preceding three paragraphs, the second layer IR reflecting layer comprising the nitride of titanium may comprise $TiN_x$, where x is from 0.8 to 1.2, more preferably from 0.9 to 1.1.

In the coated article of any of the preceding four paragraphs, the first IR reflecting layer may contains from 0-8% oxygen, more preferably from 0-5% oxygen (atomic %).

In the coated article of any of the preceding five paragraphs, the second IR reflecting layer may contain from 0-8% oxygen, more preferably from 0-5% oxygen (atomic %).

In the coated article of any of the preceding six paragraphs, the second IR reflecting layer may consist essentially of the nitride of titanium.

In the coated article of any of the preceding seven paragraphs, the coating may further comprise an overcoat comprising an oxide of zirconium.

In the coated article of any of the preceding eight paragraphs, the first IR reflecting layer comprising NiCr may be nitrided and/or may further comprise Mo.

In the coated article of any of the preceding nine paragraphs, the glass substrate may be clear glass substrate or a green glass substrate.

In the coated article of any of the preceding ten paragraphs, the coated article may have a glass side reflective a* value of from −6 to +1.0 and/or a film side reflective a* value of from −6 to +1.0.

In the coated article of any of the preceding eleven paragraphs, the coated article may have a visible transmission from 15-36%.

In the coated article of any of the preceding twelve paragraphs, the coated article may have a glass side reflective b* value of from −14 to +9 and/or a film side reflective b* value of from −14 to +9.

In the coated article of any of the preceding thirteen paragraphs, the coated article may have a glass side reflective b* value of from −9 to +4 and/or and a film side reflective b* value of from −9 to +4.

In the coated article of any of the preceding fourteen paragraphs, the coating may consist essentially of the first, second and third dielectric layers comprising silicon nitride and the first and second IR reflecting layers, and may optionally comprise an overcoat comprising an oxide of zirconium.

In the coated article of any of the preceding fifteen paragraphs, one or more of the first, second, and third dielectric layers comprising silicon nitride may further comprises oxygen and/or may be doped with aluminum.

In the coated article of any of the preceding sixteen paragraphs, the coated article may be thermally tempered and have a ΔE* value (glass side reflective) of no greater than 3.0 after and/or due to the thermal tempering.

In the coated article of any of the preceding seventeen paragraphs, the coated article may be a monolithic window (architectural or vehicle), or may be part of a laminated window or IG window unit.

In the coated article of any of the preceding eighteen paragraphs, the coated article measured monolithically may have one or more of an SHGC value of no greater than 0.52, a normal emittance ($E_n$) of no greater than 0.50, and/or an LSG of at least 0.50.

In the coated article of any of the preceding nineteen paragraphs, the coated article measured monolithically may have one or more of an SHGC value of no greater than 0.28, a normal emittance ($E_n$) of no greater than 0.28, and/or an LSG of at least 0.60.

In the coated article of any of the preceding twenty paragraphs, the coated article measured monolithically may have an LSG of at least 1.00.

In the coated article of any of the preceding twenty one paragraphs, the second IR reflecting layer comprising the nitride of titanium may be at least 50 Å (more preferably at least 100, and sometimes at least 150 Å) thicker than the first IR reflecting layer comprising NiCr.

In the coated article of any of the preceding twenty two paragraphs, the second dielectric layer comprising silicon nitride may be at least 50 Å (more preferably at least 100, and sometimes at least 300 Å) thicker than the first dielectric layer comprising silicon nitride.

In the coated article of any of the preceding twenty three paragraphs, the first IR reflecting layer may directly contact the first dielectric layer.

In the coated article of any of the preceding twenty four paragraphs, the first IR reflecting layer comprising NiCr may be from about 40-85 Å thick, and/or the second IR reflecting layer comprising the nitride of titanium may be from about 130-300 Å thick.

Once given the above disclosure many other features, modifications and improvements will become apparent to the skilled artisan. Such other features, modifications and improvements are therefore considered to be a part of this invention, the scope of which is to be determined by the following claims:

What is claimed is:

1. A coated article including a coating supported by a glass substrate, the coating comprising:
   a first dielectric layer comprising silicon nitride;
   a first infrared (IR) reflecting layer comprising NiCr on the glass substrate over at least the first dielectric layer comprising silicon nitride;
   a second dielectric layer comprising silicon nitride on the glass substrate over at least the first dielectric layer comprising silicon nitride and the first IR reflecting layer comprising NiCr;
   a second IR reflecting layer comprising a nitride of titanium on the glass substrate over at least the second dielectric layer comprising silicon nitride;
   wherein the second dielectric layer comprising silicon nitride is located between and directly contacting the first and second IR reflecting layers;
   a third dielectric layer comprising silicon nitride on the glass substrate over at least the second IR reflecting layer comprising the nitride of titanium;
   wherein the coating contains no IR reflecting layer based on silver; and
   wherein the coated article has: a visible transmission from about 12-70%, a glass side visible reflectance no greater than 14%, a film side visible reflectance no greater than about 16%, a glass side reflective a* value of from −8 to +1.6, and a film side reflective a* color value of from −8 to +1.6.

2. The coated article of claim 1, wherein the coating contains only two IR reflecting layers.

3. The coated article of claim 1, wherein the second IR reflecting layer comprising the nitride of titanium comprises $TiN_x$, where x is from 0.8 to 1.2.

4. The coated article of claim 1, wherein the second IR reflecting layer comprising the nitride of titanium comprises $TiN_x$, where x is from 0.9 to 1.1.

5. The coated article of claim 1, wherein the first IR reflecting layer contains from 0-8% oxygen (atomic %).

6. The coated article of claim 1, wherein the first IR reflecting layer contains from 0-5% oxygen (atomic %).

7. The coated article of claim 1, wherein the second IR reflecting layer contains from 0-5% oxygen (atomic %).

8. The coated article of claim 1, wherein the second IR reflecting layer contains from 0-5% oxygen (atomic %).

9. The coated article of claim 1, where each of the first and second IR reflecting layers comprise from 0-5% oxygen (atomic %).

10. The coated article of claim 1, where the second IR reflecting layer consists essentially of the nitride of titanium.

11. The coated article of claim 1, wherein the coating further comprises an overcoat comprising an oxide of zirconium.

12. The coated article of claim 1, the first IR reflecting layer comprising NiCr is nitrided.

13. The coated article of claim 1, wherein the first IR reflecting layer further comprises Mo.

14. The coated article of claim 1, wherein the glass substrate is a clear glass substrate.

15. The coated article of claim 1, wherein the glass substrate is a green glass substrate.

16. The coated article of claim 1, wherein the coated article has a glass side reflective a* value of from −6 to +1.0, and a film side reflective a* value of from −6 to +1.0.

17. The coated article of claim 1, wherein the coated article has a visible transmission from 15-36%.

18. The coated article of claim 1, wherein the coated article has a glass side reflective b* value of from −14 to +9, and a film side reflective b* value of from −14 to +9.

19. The coated article of claim 1, wherein the coated article has a glass side reflective b* value of from −9 to +4, and a film side reflective b* value of from −9 to +4.

20. The coated article of claim 1, wherein the coating consists essentially of the first, second and third dielectric layers comprising silicon nitride and the first and second IR reflecting layers, and may optionally comprise an overcoat comprising an oxide of zirconium.

21. The coated article of claim 1, wherein one or more of the first, second, and third dielectric layers comprising silicon nitride further comprises oxygen and is doped with aluminum.

22. The coated article of claim 1, wherein the coated article is thermally tempered and has a ΔE* value (glass side reflective) of no greater than 3.0 after and/or due to the thermal tempering.

23. The coated article of claim 1, wherein the coated article is a monolithic window.

24. The coated article of claim 1, wherein the coated article measured monolithically has an SHGC value of no greater than 0.52, a normal emittance ($E_n$) of no greater than 0.50, and an LSG of at least 0.50.

25. The coated article of claim 1, wherein the coated article measured monolithically has an LSG of at least 1.00.

26. The coated article of claim 1, wherein the second IR reflecting layer comprising the nitride of titanium is at least 50 Å thicker than the first IR reflecting layer comprising NiCr.

27. The coated article of claim 1, wherein the second IR reflecting layer comprising the nitride of titanium is at least 100 Å thicker than the first IR reflecting layer comprising NiCr.

28. The coated article of claim 1, wherein the second dielectric layer comprising silicon nitride is at least 100 Å thicker than the first dielectric layer comprising silicon nitride.

29. The coated article of claim 1, wherein the first IR reflecting layer directly contacts the first dielectric layer.

30. The coated article of claim 1, wherein the first IR reflecting layer comprising NiCr is from about 40-85 Å thick, and the second IR reflecting layer comprising the nitride of titanium is from about 130-300 Å thick.

31. A coated article including a coating supported by a glass substrate, the coating comprising:
- a first dielectric layer;
- a first infrared (IR) reflecting layer comprising Ni and Cr on the glass substrate over at least the first dielectric layer;
- a second dielectric layer comprising silicon nitride on the glass substrate over at least the first dielectric and the first IR reflecting layer;
- a second IR reflecting layer comprising a nitride of titanium on the glass substrate over at least the second dielectric layer comprising silicon nitride;
- wherein the second dielectric layer comprising silicon nitride is located between and directly contacting the first and second IR reflecting layers;
- a third dielectric layer on the glass substrate over at least the second IR reflecting layer comprising the nitride of titanium;
- wherein the coating contains no IR reflecting layer based on silver; and
- wherein the coated article measured monolithically has: a visible transmission from about 12-70%, a glass side visible reflectance no greater than 14%, a film side visible reflectance no greater than about 16%, a glass side reflective a* value of from −8 to +1.6, and a film side reflective a* color value of from −8 to +1.6.

32. The coated article of claim 31, wherein the coating contains only two IR reflecting layers.

33. The coated article of claim 31, wherein the second layer IR reflecting layer comprising the nitride of titanium comprises $TiN_x$, where x is from 0.8 to 1.2.

34. The coated article of claim 31, wherein the first and second IR reflecting layers each contain from 0-5% oxygen (atomic %).

35. A coated article including a coating supported by a glass substrate, the coating comprising:
- a first dielectric layer;
- a first infrared (IR) reflecting layer comprising NiCr on the glass substrate over at least the first dielectric layer;
- a second dielectric layer comprising silicon nitride on the glass substrate over at least the first dielectric and the first IR reflecting layer;
- a second IR reflecting layer comprising a nitride of titanium on the glass substrate over at least the second dielectric layer comprising silicon nitride;
- wherein the second dielectric layer comprising silicon nitride is located between and directly contacting the first and second IR reflecting layers;
- a third dielectric layer on the glass substrate over at least the second IR reflecting layer comprising the nitride of titanium;
- wherein the coating contains no IR reflecting layer based on silver; and
- wherein the coated article measured monolithically has a visible transmission from about 12-70% and one or more of: (a) a glass side visible reflectance no greater than 14%, (b) a film side visible reflectance no greater than about 16%, (c) a glass side reflective a* value of from −8 to +1.6, and (b) a film side reflective a* color value of from −8 to +1.6.

* * * * *